(12) United States Patent
Dussarrat et al.

(10) Patent No.: US 8,298,616 B2
(45) Date of Patent: Oct. 30, 2012

(54) HETEROLEPTIC CYCLOPENTADIENYL TRANSITION METAL PRECURSORS FOR DEPOSITION OF TRANSITION METAL-CONTAINING FILMS

(75) Inventors: Christian Dussarrat, Wilmington, DE (US); Clement Lansalot-Matras, Tsukuba (JP)

(73) Assignee: American Air Liquide, Inc., Fremont, CA (US)

( * ) Notice: Subject to any disclaimer, the term of this patent is extended or adjusted under 35 U.S.C. 154(b) by 600 days.

(21) Appl. No.: 12/509,024

(22) Filed: Jul. 24, 2009

(65) Prior Publication Data

US 2010/0021747 A1 Jan. 28, 2010

Related U.S. Application Data

(60) Provisional application No. 61/083,421, filed on Jul. 24, 2008.

(51) Int. Cl.
*B05D 3/02* (2006.01)
(52) U.S. Cl. .................. 427/255.28; 427/226
(58) Field of Classification Search .................. 427/226, 427/255.28
See application file for complete search history.

(56) References Cited

U.S. PATENT DOCUMENTS

| | | | |
|---|---|---|---|
| 2005/0042372 A1* | 2/2005 | Denk et al. | 427/248.1 |
| 2008/0102205 A1* | 5/2008 | Barry et al. | 427/250 |
| 2008/0107812 A1* | 5/2008 | Dussarrat et al. | 427/255.28 |
| 2008/0317972 A1* | 12/2008 | Hendriks et al. | 427/569 |

FOREIGN PATENT DOCUMENTS

| | | |
|---|---|---|
| WO | WO 2008 088563 | 7/2008 |
| WO | WO 2009 013721 | 1/2009 |

OTHER PUBLICATIONS

Musgrave, C.B. et al. "Precursors for atomic layer deposition of high-k dielectrics," FutureFab International, 2005, 18, 126-128 (Process Gases, Chemicals, and Materials, Section 7).
Lim, B.S. et al. "Synthesis and characterization of volatile, thermally stable, reactive transition metal amidinates," Inorganic Chemistry, 2003, 42, 7951-7958.
Yamaguchi, Y. et al. "($\eta^5$-$C_5Me_5$)Ru(amidinate): Highly reactive ruthenium complexes formally bearing 16 valence electrons showing signs of coordinative unsaturation," Organometallics, 2000, 19, pp. 725-727.
International Search Report and Written Opinion for PCT/IB2009/053252, (2010).

* cited by examiner

*Primary Examiner* — Michael Cleveland
*Assistant Examiner* — Robert Vetere
(74) *Attorney, Agent, or Firm* — Patricia E. McQueeney

(57) ABSTRACT

Methods and compositions for depositing a film on one or more substrates include providing a reactor with at least one substrate disposed in the reactor. At least one metal precursor are provided and at least partially deposited onto the substrate to form a metal-containing film.

19 Claims, No Drawings

HETEROLEPTIC CYCLOPENTADIENYL TRANSITION METAL PRECURSORS FOR DEPOSITION OF TRANSITION METAL-CONTAINING FILMS

BACKGROUND

1. Field of the Invention

This invention relates generally to compositions, methods and apparatus used for use in the manufacture of semiconductor, photovoltaic, LCF-TFT, or flat panel type devices.

2. Background of the Invention

During the fabrication of a transistor, silicide layers may be used to improve the conductivity of polysilicon. For instance nickel silicide (NiSi) may be used as a contact in the source and drain of the transistor to improve conductivity. The process to form metal silicide begins by the deposition of a thin transition metal layer, nickel for instance, on the polysilicon. The metal and a portion of the polysilicon are then alloyed together to form the metal silicide layer.

Chemical Vapor Deposition (CVD) and Atomic Layer Deposition (ALD) are the main gas phase chemical process used to control deposition at the atomic scale and create extremely thin coatings. In a typical CVD process, the wafer is exposed to one or more volatile precursors, which react and/or decompose on the substrate surface to produce the desired deposit. ALD process are based on sequential and saturating surface reactions of alternatively applied metal precursor, separated by inert gas purging.

In order to get high-purity, thin and high-performance solid materials on the wafer, metal precursors with high purity, high thermal stability, and high volatility are required. Furthermore, they should vaporize rapidly and at a reproducible rate, a condition which is more easily achieved for liquid precursors, than it is for solid precursors.

Some amidinate transition metal precursors are and have been successfully used for deposition by ALD. Although volatile, those precursors are usually solids with high melting point (>70° C.) and can suffer some time from thermal instability (nickel for instance), which is a drawback for the ALD process. On the other hand, bis-cyclopentadienyl precursors are known to be liquid or low melting point solid, and still volatile depending on the substitution on the cyclopentadienyl. For instance, Ni(Me-Cp)$_2$: solid mp=34-36° C., Ni(Et-Cp)$_2$: liquid, Ni(iPr-Cp)$_2$: liquid. However bis-cyclopentadienyl precursors still suffer from thermal instability, with nickel for instance.

Consequently there exists a need for new transition metal precursors suitable for CVD or ALD process.

BRIEF SUMMARY

Embodiments of the present invention provide novel methods and compositions useful for the deposition of a film on a substrate. In general, the disclosed compositions and methods utilize a heteroleptic metal precursor.

In an embodiment, a method for depositing a film on a substrate comprises providing a reactor with at least one substrate disposed in the reactor. A metal-containing precursor is introduced into the reactor, wherein the precursor has the general formula:

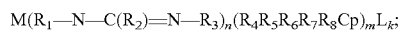

wherein M is a metal selected from among the elements Mn, Fe, Ni, Co, Pd, Pt, Ag, Au, Ru, Os, Rh, Ir, and Re. (R$_1$—N—C(R$_2$)=N—R$_3$) is an amidine or guanidine ligand, and (R$_4$R$_5$R$_6$R$_7$R$_8$Cp) is a, substituted or unsubstituted, cyclopentadienyl ligand. Each of R$_1$, R$_3$, R$_4$, R$_5$, R$_6$, R$_7$, and R$_8$ are independently selected from H, a C1-C5 alkyl group, and Si(R')$_3$. where R' is independently selected from H, and a C1-C5 alkyl group. R$_2$ is independently selected from H, a C1-C5 alkyl group, and NR'R", where R' and R" are independently selected from C1-C5 alkyl groups. L is a neutral ligand (e.g. THF, diethylether, triglyme, tetraglyme, etc). The variable m is one of 1, 2, 3, or 4; the variable n is one of 1, 2, 3, or 4; and the variable k is one of 0, 1, 2, 3, 4, or 5. The reactor is maintained at a temperature of at least about 100° C.; and the precursor is contacted with the substrate to deposit or form a metal-containing film on the substrate.

In an embodiment, a heteroleptic cyclopentadienyl transition metal precursor is synthesized through at least one synthesis reaction. The precursor has the general formula:

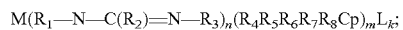

wherein M is a metal selected from among the elements Mn, Fe, Ni, Co, Pd, Pt, Ag, Au, Ru, Os, Rh, Ir, and Re. (R$_1$—N—C(R$_2$)=N—R$_3$) is an amidine or guanidine ligand, and (R$_4$R$_5$R$_6$R$_7$R$_8$Cp) is a, substituted or unsubstituted, cyclopentadienyl ligand. Each of R$_1$, R$_3$, R$_4$, R$_5$, R$_6$, R$_7$, and R$_8$ are independently selected from H, a C1-C5 alkyl group, and Si(R')$_3$, where R' is independently selected from H, and a C1-C5 alkyl group. R$_2$ is independently selected from H, a C1-C5 alkyl group, and NR'R", where R' and R" are independently selected from C1-C5 alkyl groups. L is a neutral ligand (e.g. THF, diethylether, triglyme, tetraglyme, etc). The variable m is one of 1, 2, 3, or 4; the variable n is one of 1, 2, 3, or 4; and the variable k is one of 0, 1, 2, 3, 4, or 5.

Other embodiments of the current invention may include, without limitation, one or more of the following features:
- the reactor is maintained at a temperature between about 100° C. and 500° C., and preferably between about 150° C. and 350° C.;
- the reactor is maintained at a pressure between about 1 Pa and 10$^5$ Pa, and preferably between about 25 Pa and 10$^3$ PA;
- a reducing gas is introduced to the reactor, and the reducing gas is reacted with at least part of the precursor, prior to or concurrently with the deposition of at least part of the precursor onto the substrate;
- the reducing gas is one of H$_2$; NH$_3$; SiH$_4$; Si$_2$H$_6$; Si$_3$H$_8$, SiH$_2$Me$_2$, SiH$_2$Et$_2$, N(SiH$_3$)$_3$, hydrogen radicals; and mixtures thereof;
- an oxidizing gas is introduced to the reactor, and the oxidizing gas is reacted with at least part of the precursor, prior to or concurrently with the deposition of at least part of the precursor onto the substrate;
- the oxidizing gas is one of O$_2$; O$_3$; H$_2$O; NO; oxygen radicals; and mixtures thereof;
- the deposition process is a chemical vapor deposition ("CVD") type process or an atomic layer deposition ("ALD") type process, and either may be plasma enhanced;
- the precursor is synthesized according to at least one synthesis scheme;
- a metal-containing thin film coated substrate;
- the precursor is a nickel containing precursor selected from: (cyclopentadienyl)-(bis-isopropylacetamidinate)- nickel; (methylcyclopentadienyl)-(bis-isopropylacetamidinate)-nickel; (ethylcyclopentadienyl)-(bis-isopropylacetamidinate)-nickel; (isopropylcyclopentadienyl)-(bis-isopropylacetamidinate)-nickel; (tetramethylcyclopentadienyl)-(bis-isopropylacetamidinate)-nickel; (cyclopentadienyl)-(methyl-isopropylacetamidinate)-nickel; (methylcyclopentadienyl)-(methyl-isopropylacetamidinate)-nickel; (ethylcyclopentadienyl)-(methyl-isopropylacetamidinate)-nickel; (cyclopentadienyl)-(methyl-ethylacetamidinate)-nickel; (methylcyclopentadienyl)-(methyl-ethylacetamidinate)-nickel; (ethylcyclopentadienyl)-(methyl-ethylacetamidinate)-nickel; (cyclopentadienyl)-(bis-isopropylformamidinate)-nickel; (methylcyclopentadienyl)-(bis-isopropylformamidinate)-nickel; and (ethylcyclopentadienyl)-(bis-isopropylformamidinate)-nickel;

the precursor is a cobalt containing precursor selected from: (cyclopentadienyl)-(bis-isopropylacetamidinate)-cobalt; (methylcyclopentadienyl)-(bis-isopropylacetamidinate)-cobalt; (ethylcyclopentadienyl)-(bis-isopropylacetamidinate)-cobalt; (isopropylcyclopentadienyl)-(bis-isopropylacetamidinate)-cobalt; (tetramethylcyclopentadienyl)-(bis-isopropylacetamidinate)-cobalt; (cyclopentadienyl)-(methyl-isopropylacetamidinate)-cobalt; (methylcyclopentadienyl)-(methyl-isopropylacetamidinate)-cobalt; (ethylcyclopentadienyl)-(methyl-isopropylacetamidinate)-cobalt; (cyclopentadienyl)-(methyl-ethylacetamidinate)-cobalt; (methylcyclopentadienyl)-(methyl-ethylacetamidinate)-cobalt; (ethylcyclopentadienyl)-(methyl-ethylacetamidinate)-cobalt; (cyclopentadienyl)-(bis-isopropylformamidinate)-cobalt; (methylcyclopentadienyl)-(bis-isopropylformamidinate)-cobalt; and (ethylcyclopentadienyl)-(bis-isopropylformamidinate)-cobalt; and the precursor is a ruthenium containing precursor selected from: (cyclopentadienyl)-(bis-isopropylacetamidinate)-ruthenium; (methylcyclopentadienyl)-(bis-isopropylacetamidinate)-ruthenium; (ethylcyclopentadienyl)-(bis-isopropylacetamidinate)-ruthenium; (isopropylcyclopentadienyl)-(bis-isopropylacetamidinate)-ruthenium; (tetramethylcyclopentadienyl)-(bis-isopropylacetamidinate)-ruthenium; (cyclopentadienyl)-(methyl-isopropylacetamidinate)-ruthenium; (methylcyclopentadienyl)-(methyl-isopropylacetamidinate)-ruthenium; (ethylcyclopentadienyl)-(methyl-isopropylacetamidinate)-ruthenium; (cyclopentadienyl)-(methyl-ethylacetamidinate)-ruthenium; (methylcyclopentadienyl)-(methyl-ethylacetamidinate)-ruthenium; (ethylcyclopentadienyl)-(methyl-ethylacetamidinate)-ruthenium; (cyclopentadienyl)-(bis-isopropylformamidinate)-ruthenium; (methylcyclopentadienyl)-(bis-isopropylformamidinate)-ruthenium; and (ethylcyclopentadienyl)-(bis-isopropylformamidinate)-ruthenium.

The foregoing has outlined rather broadly the features and technical advantages of the present invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

Notation and Nomenclature

Certain terms are used throughout the following description and claims to refer to various components and constituents. This document does not intend to distinguish between components that differ in name but not function. Generally as used herein, elements from the periodic table have been abbreviated according to their standard abbreviation (e.g. Ru=ruthenium, Co=cobalt, Ni=nickel, etc).

As used herein, the term "alkyl group" refers to saturated functional groups containing exclusively carbon and hydrogen atoms. Further, the term "alkyl group" may refer to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation cyclopropyl groups, cyclopentyl groups, cyclohexyl groups, etc.

As used herein, the abbreviation, "Me," refers to a methyl group; the abbreviation, "Et," refers to an ethyl group; the abbreviation, "t-Bu," refers to a tertiary butyl group; the abbreviation "iPr", refers to an isopropyl group; the abbreviation "acac", refers to acetylacetonato; and the abbreviation "Cp" refers to a cyclopentadienyl group.

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

DESCRIPTION OF PREFERRED
EMBODIMENTS

Embodiments of the present invention provide novel methods and compositions useful for the deposition of a film on a substrate. Methods to synthesize these compositions are also provided. In general, the disclosed compositions and methods utilize a heteroleptic metal precursor.

Generally, the combination of a cyclopentadiene ligand with an amidinate ligand into a new heteroleptic metal precursor creates a new precursor having a lower melting point than the homoleptic parent. The new precursor is also more volatile and thermally more stable than the homoleptic parent.

Some embodiments of the invention relate to a metal-containing precursor, and methods for depositing a metal-containing film with the precursor.

In these embodiments, the metal-containing precursor has the general formula (1)

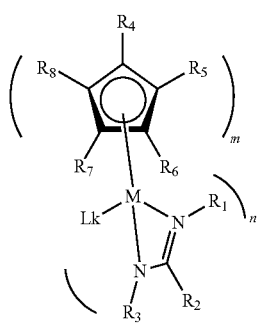

(1)

wherein M is a metal selected from among the elements Mn, Fe, Ni, Co, Pd, Pt, Ag, Au, Ru, Os, Rh, Ir, and Re, and preferably, M is selected from the elements Ni, Co, and Ru. ($R_1$—N—C($R_2$)=N—$R_3$) is an amidine or guanidine ligand (preferably bis isopropylacetamidinate where $R_1$=$R_3$=isopropyl and $R_2$=methyl), and $R_4R_5R_6R_7R_8$Cp) is a, substituted or unsubstituted, cyclopentadienyl ligand (preferably methylcyclopentadienyl, wherein $R_4$=Me and $R_5$=$R_6$=$R_7$=$R_8$=H; or tetramethylcyclopentadienyl, wherein $R_4$=H and $R_5$=$R_6$=$R_7$=$R_8$=Me). Each of $R_1$, $R_3$, $R_4$, $R_5$, $R_6$, $R_7$, and $R_8$ are independently selected from H, a C1-C5 alkyl group, and Si(R')$_3$ where R' is independently selected from H, and a C1-C5 alkyl group. $R_2$ is independently selected from H, a C1-C5 alkyl group, and NR'R", where R' and R" are independently selected from C1-C5 alkyl groups. L is a neutral ligand (e.g. THF, diethylether, triglyme, tetraglyme, etc). The variable m is one of 1, 2, 3, or 4, and preferably is 1; the variable n is one of 1, 2, 3, or 4, and is preferably 1; and the variable k is one of 0, 1, 2, 3, 4, or 5, and is preferably 0.

In some embodiments, these precursors exhibit properties making desirable for use in deposition type process (e.g. CVD, ALD, etc). Desirable properties of the metal precursors for these applications include: i) liquid form or low melting point solid at room temperature. More preferably the precursor will be in a liquid form during the deposition process (i.e. at process conditions); ii) high volatility; iii) sufficient thermal stability to avoid decomposition during handling and delivery; iv) appropriate reactivity during CVD/ALD process.

In some embodiments, the first metal precursor may be one of the following precursors, which are shown structurally below also:

(2) (cyclopentadienyl)-(bis-isopropylacetamidinate)-nickel;
(3) (methylcyclopentadienyl)-(bis-isopropylacetamidinate)-nickel;
(4) (ethylcyclopentadienyl)-(bis-isopropylacetamidinate)-nickel;
(5) (isopropylcyclopentadienyl)-(bis-isopropylacetamidinate)-nickel;
(6) (tetramethylcyclopentadienyl)-(bis-isopropylacetamidinate)-nickel;
(7) (cyclopentadienyl)-(methyl-isopropylacetamidinate)-nickel;
(8) (methylcyclopentadienyl)-(methyl-isopropylacetamidinate)-nickel;
(9) (ethylcyclopentadienyl)-(methyl-isopropylacetamidinate)-nickel;
(10) (cyclopentadienyl)-(methyl-ethylacetamidinate)-nickel;
(11) (methylcyclopentadienyl)-(methyl-ethylacetamidinate)-nickel;
(12) (ethylcyclopentadienyl)-(methyl-ethylacetamidinate)-nickel;
(13) (cyclopentadienyl)-(bis-isopropylformamidinate)-nickel;
(14) (methylcyclopentadienyl)-(bis-isopropylformamidinate)-nickel;
(15) (ethylcyclopentadienyl)-(bis-isopropylformamidinate)-nickel;

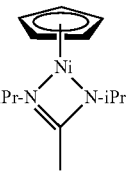

(2)

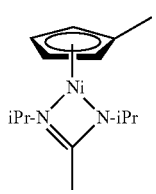

(3)

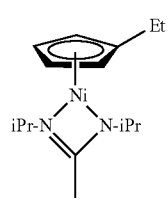

(4)

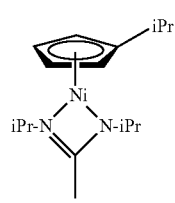

(5)

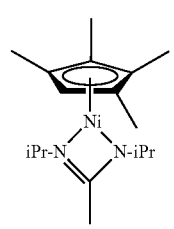

(6)

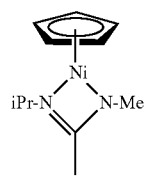

(7)

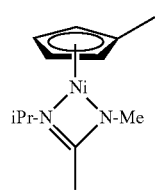

(8)

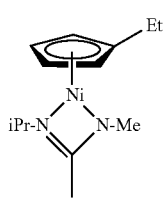
(9)

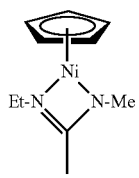
(10)

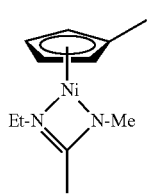
(11)

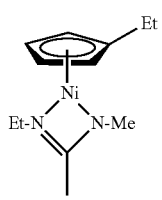
(12)

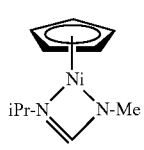
(13)

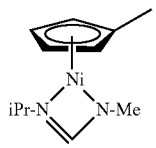
(14)

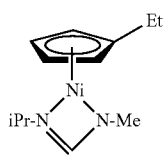
(15)

(16) (cyclopentadienyl)-(bis-isopropylacetamidinate)-cobalt;
(17) (methylcyclopentadienyl)-(bis-isopropylacetamidinate)-cobalt;
(18) (ethylcyclopentadienyl)-(bis-isopropylacetamidinate)-cobalt;
(19) (isopropylcyclopentadienyl)-(bis-isopropylacetamidinate)-cobalt;
(20) (tetramethylcyclopentadienyl)-(bis-isopropylacetamidinate)-cobalt;
(21) (cyclopentadienyl)-(methyl-isopropylacetamidinate)-cobalt;
(22) (methylcyclopentadienyl)-(methyl-isopropylacetamidinate)-cobalt;
(23) (ethylcyclopentadienyl)(methyl-isopropylacetamidinate)-cobalt;
(24) (cyclopentadienyl)-(methyl-ethylacetamidinate)-cobalt;
(25) (methylcyclopentadienyl)-(methyl-ethylacetamidinate)-cobalt;
(26) (ethylcyclopentadienyl)-(methyl-ethylacetamidinate) cobalt;
(27) (cyclopentadienyl)-(bis-isopropylformamidinate)-cobalt;
(28) (methylcyclopentadienyl)-(bis-isopropylformamidinate)-cobalt;
(29) (ethylcyclopentadienyl)-(bis-isopropylformamidinate)-cobalt;

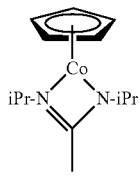
(16)

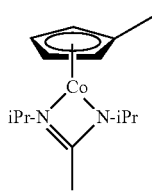
(17)

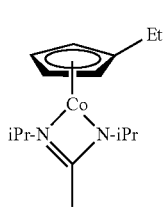
(18)

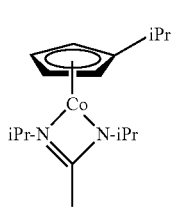
(19)

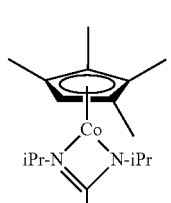
(20)

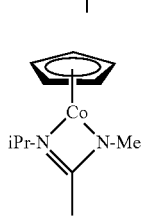
(21)

-continued

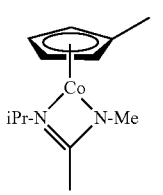
(22)

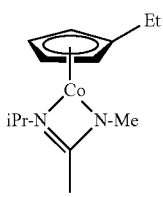
(23)

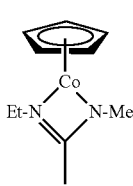
(24)

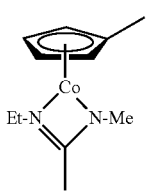
(25)

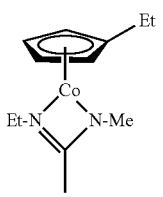
(26)

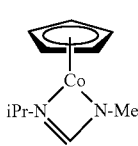
(27)

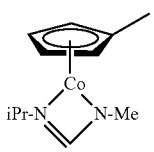
(28)

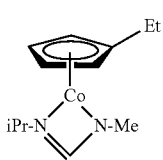
(29)

(30) (cyclopentadienyl)-(bis-isopropylacetamidinate)-ruthenium;
(31) (methylcyclopentadienyl)-(bis-isopropylacetamidinate)-ruthenium;
(32) (ethylcyclopentadienyl)-(bis-isopropylacetamidinate)-ruthenium;
(33) (isopropylcyclopentadienyl)-(bis-isopropylacetamidinate)-ruthenium;
(34) (tetramethylcyclopentadienyl)-(bis-isopropylacetamidinate)-ruthenium;
(35) (cyclopentadienyl)-(methyl-isopropylacetamidinate)-ruthenium;
(36) (methylcyclopentadienyl)-(methyl-isopropylacetamidinate)-ruthenium;
(37) (ethylcyclopentadienyl)-(methyl-isopropylacetamidinate)-ruthenium;
(38) (cyclopentadienyl)-(methyl-ethylacetamidinate)-ruthenium;
(39) (methylcyclopentadienyl)-(methyl-ethylacetamidinate)-ruthenium;
(40) (ethylcyclopentadienyl)-(methyl-ethylacetamidinate)-ruthenium;
(41) (cyclopentadienyl)-(bis-isopropylformamidinate)-ruthenium;
(42) (methylcyclopentadienyl)-(bis-isopropylformamidinate)-ruthenium;
(43) (ethylcyclopentadienyl)-(bis-isopropylformamidinate)-ruthenium.

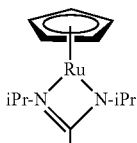
(30)

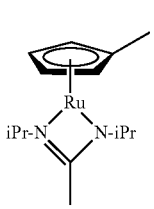
(31)

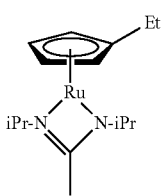
(32)

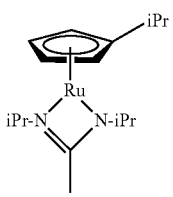
(33)

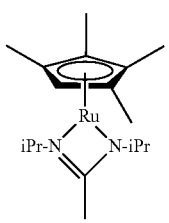
(34)

-continued

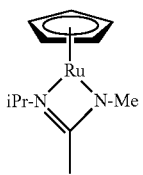

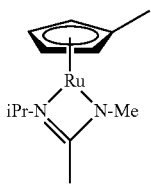

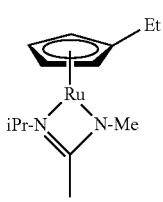

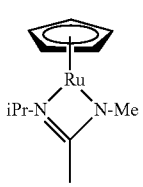

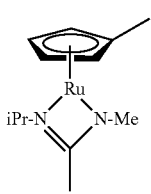

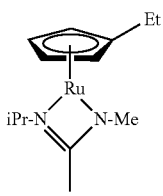

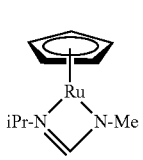

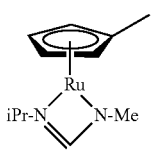

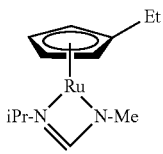

Some embodiments of the present invention describe the synthesis of a heteroleptic amidinate(or guanidinate)/cyclopentadienyl metal precursor, in order to prepare a liquid or a low melting point solid metal precursor, volatile and suitable for ALD process. In some embodiments, the molecular formula is:

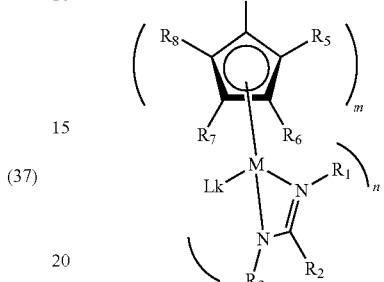

(1)

$$M(R_1-N-C(R_2)=N-R_3)_n(R_4R_5R_6R_7R_8Cp)_m L_k;$$ (1)

wherein M is a metal selected from among the elements Mn, Fe, Ni, Co, Pd, Pt, Ag, Au, Ru, Os, Rh, Ir, and Re, and preferably, M is selected from the elements Ni, Co, and Ru. $(R_1-N-C(R_2)=N-R_3)$ is an amidine or guanidine ligand (preferably bis isopropylacetamidinate where $R=R_3=$isopropyl and $R_2=$methyl), and $(R_4R_5R_6R_7R_8Cp)$ is a, substituted or unsubstituted, cyclopentadienyl ligand (preferably methylcyclopentadienyl, wherein $R_4=$methyl and $R_5=R_6=R_7=R_8=$H; or tetramethylcyclopentadienyl, wherein $R_4=$H and $R_5=R_6=R_7=R_8=$methyl). Each of $R_1$, $R_3$, $R_4$, $R_5$, $R_6$, $R_7$, and $R_8$ are independently selected from H, a C1-C5 alkyl group, and Si(R')$_3$, where R' is independently selected from H, and a C1-C5 alkyl group. $R_2$ is independently selected from H, a C1-C5 alkyl group, and NR'R", where R' and R" are independently selected from C1-C5 alkyl groups. L is a neutral ligand (e.g. THF, diethylether, triglyme, tetraglyme, etc). The variable m is one of 1, 2, 3, or 4, and preferably is 1; the variable n is one of 1, 2, 3, or 4, and is preferably 1; and the variable k is one of 0, 1, 2, 3, 4, or 5, and is preferably 0.

Some embodiments describe The synthesis of $M(R_1-N-C(R_2)=N-R_3)_n(R_4R_5R_6R_7R_8Cp)_m L_k$, which may be carried out by the following methods"

Method A: By reacting $[M(R_4R_5R_6R_7R_8Cp)_m X_n Q_j]_p$ (where X=Cl, Br or I; Q is a neutral ligand (PPh$_3$ for instance); j, p, and k are independently selected from 0 to 5; and m and n are independently selected from 1 to 4) with n equivalents of $N(R_1-N-C(R_2)=N-R_3)$ (Scheme-1), where N=Li, Na, K.

Scheme-1

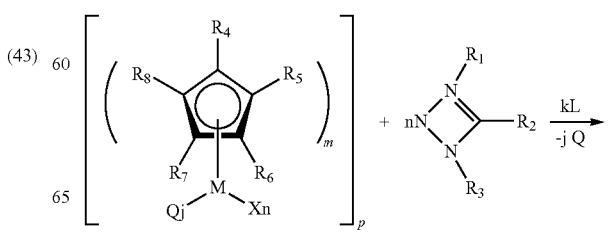

-continued

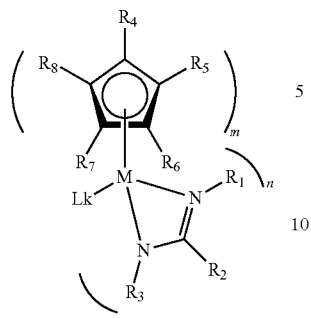

Methods B1 & B2:

Method B1: By reacting $M(R_4R_5R_6R_7R_8Cp)_{m+n}$ (where m and n are independently selected from 1 to 4; and k is independently selected from 0 to 5) with n equivalent $N(R_1—N—C(R_2)=N—R_3)$ (Scheme-2), where N=H, Li, Na, K.

Scheme-2-1

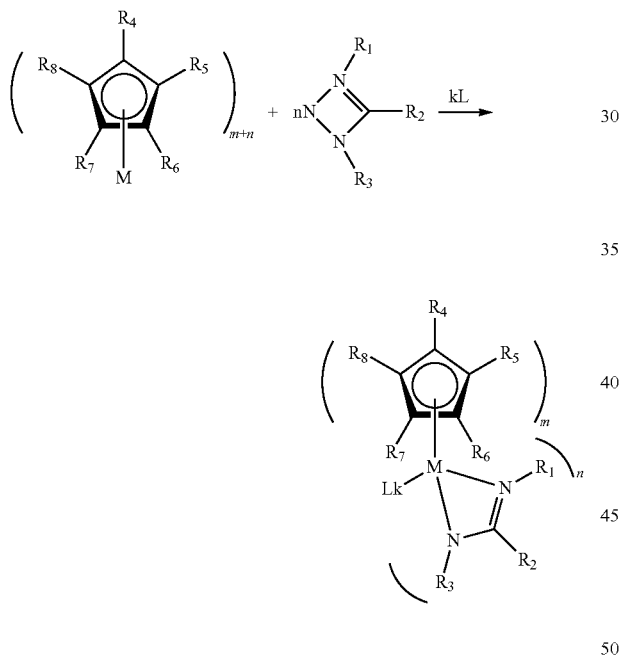

Method B2: By reacting $M(R_1—N—C(R_2)=N—R_3)_{m+n}$ (where m and n are independently selected from 1 to 4; and k is independently selected from 0 to 5) with m equivalent of $N(R_4R_5R_6R_7R_8Cp)$ (Scheme-2-2), where N=H, Li, Na, K.

Scheme-2-2

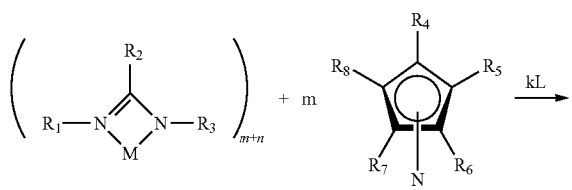

Methods C1 & C2:

Method C1: in-situ reacting $[MX_{m+n}]_p$ (where X=Cl, Br, I; j, p, and k are independently selected from 0 to 5; and m and n are independently selected from 1 to 4) (in a stepwise reaction without isolation of intermediate products) with m equivalent of $N(R_4R_5R_6R_7R_8Cp)$ (where N=Li, Na, K) eventually under reflux, eventually followed by filtration, and reacting the filtrate with n equivalent of $N(R_1—N—C(R_2)=N—R_3)$ (where N=Li, Na, K) (Scheme-3-1).

Scheme-3-1

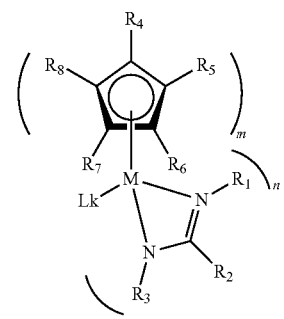

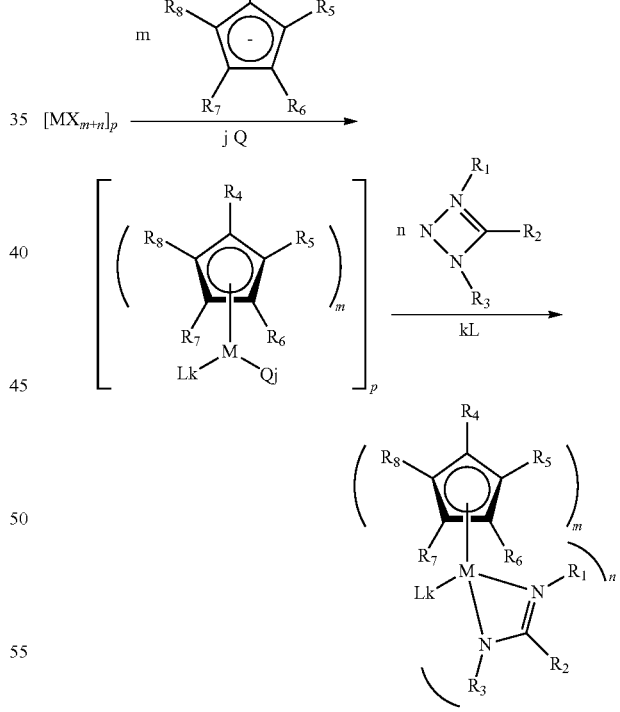

Method C2: in-situ reacting $MX_{m+n}$ (where X=Cl, Br, I; j, p, and k are independently selected from 0 to 5; and m and n are independently selected from 1 to 4) (in a stepwise reaction without isolation of intermediate products) with n equivalent of $N(R_1—N—C(R_2)=N—R_3)$ (where N=Li, Na, K) eventually under reflux, eventually followed by filtration, and reacting the filtrate with m equivalent of $N(R_4R_5R_6R_7R_8Cp)$ (where N=Li, Na, K) (Scheme-3-2).

Scheme-3-2

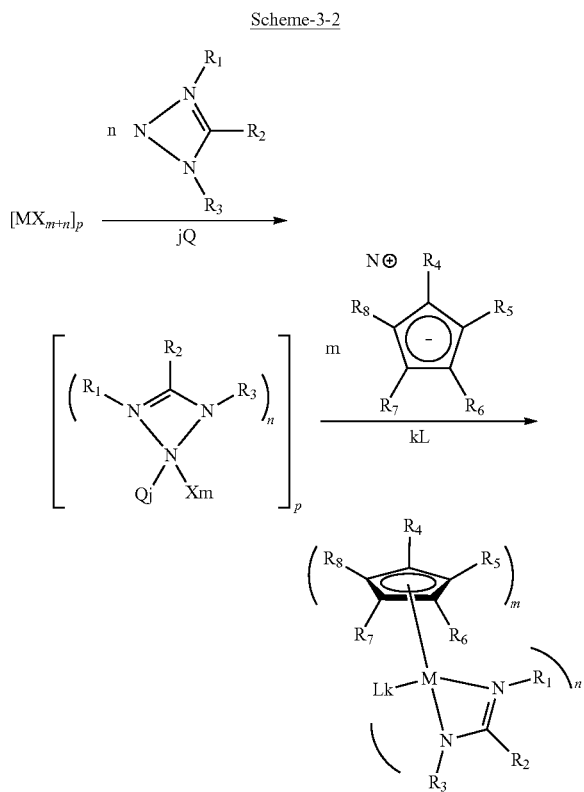

The precursor can be delivered in neat form or in a blend with a suitable solvent: preferably Ethyl benzene, Xylenes, Mesitylene, Decane, and Dodecane in different concentrations.

In some embodiments, the present invention also describes the method for depositing a film containing metal using the precursors with general molecular formula, (1) $M(R_1-N-C(R_2)=N-R_3)_n(R_4R_5R_6R_7R_8Cp)_mL_k$.

In some embodiments, the deposited films will the general formula M, $M_kSi_l$, $M_nO_m$ or $M_xN_yO_z$, where k, l, m, n, x, y range from 1 to 6.

The disclosed precursors may be deposited to form a thin film using any deposition methods known to those of skill in the art. Examples of suitable deposition methods include without limitation, conventional CVD, low pressure chemical vapor deposition (LPCVD), plasma enhanced chemical vapor depositions (PECVD), atomic layer deposition (ALD), pulsed chemical vapor deposition (P-CVD), plasma enhanced atomic layer deposition (PE-ALD), or combinations thereof.

In an embodiment, the first precursor is introduced into a reactor in vapor form. The precursor in vapor form may be produced by vaporizing a liquid precursor solution, through a conventional vaporization step such as direct vaporization, distillation, or by bubbling an inert gas (e.g. $N_2$, He, Ar, etc.) into the precursor solution and providing the inert gas plus precursor mixture as a precursor vapor solution to the reactor. Bubbling with an inert gas may also remove any dissolved oxygen present in the precursor solution.

The reactor may be any enclosure or chamber within a device in which deposition methods take place such as without limitation, a cold-wall type reactor, a hot-wall type reactor, a single-wafer reactor, a multi-wafer reactor, or other types of deposition systems under conditions suitable to cause the precursors to react and form the layers.

Generally, the reactor contains one or more substrates on to which the thin films will be deposited. The one or more substrates may be any suitable substrate used in semiconductor, photovoltaic, flat panel, or LCD-TFT device manufacturing. Examples of suitable substrates include without limitation, silicon substrates, silica substrates, silicon nitride substrates, silicon oxy nitride substrates, tungsten substrates, or combinations thereof. Additionally, substrates comprising tungsten or noble metals (e.g. platinum, palladium, rhodium, or gold) may be used. The substrate may also have one or more layers of differing materials already deposited upon it from a previous manufacturing step.

In some embodiments, in addition to the first precursor, a reactant gas may also be introduced into the reactor. In some of these embodiments, the reactant gas may be an oxidizing gas such as one of oxygen, ozone, water, hydrogen peroxide, nitric oxide, nitrogen dioxide, radical species of these, as well as mixtures of any two or more of these. In some other of these embodiments, the reactant gas may be a reducing gas such as one of hydrogen, ammonia, a silane (e.g. $SiH_4$; $Si_2H_6$; $Si_3H_8$), $SiH_2Me_2$; $SiH_2Et_2$; $N(SiH_3)_3$; radical species of these, as well as mixtures of any two or more of these.

In some embodiments, and depending on what type of film is desired to be deposited, a second precursor may be introduced into the reactor. The second precursor comprises another metal source, such as copper, praseodymium, manganese, ruthenium, titanium, tantalum, bismuth, zirconium, hafnium, lead, niobium, magnesium, aluminum, lanthanum, or mixtures of these. In embodiments where a second metal-containing precursor is utilized, the resultant film deposited on the substrate may contain at least two different metal types.

The first precursor and any optional reactants or precursors may be introduced sequentially (as in ALD) or simultaneously (as in CVD) into the reaction chamber. In some embodiments, the reaction chamber is purged with an inert gas between the introduction of the precursor and the introduction of the reactant. In one embodiment, the reactant and the precursor may be mixed together to form a reactant/precursor mixture, and then introduced to the reactor in mixture form. In some embodiments, the reactant may be treated by plasma, in order to decompose the reactant into its radical form. In some of these embodiments, the plasma may generally be at a location removed from the reaction chamber, for instance, in a remotely located plasma system. In other embodiments, the plasma may be generated or present within the reactor itself. One of skill in the art would generally recognize methods and apparatus suitable for such plasma treatment.

Depending on the particular process parameters, deposition may take place for a varying length of time. Generally, deposition may be allowed to continue as long as desired or necessary to produce a film with the necessary properties. Typical film thicknesses may vary from several hundred angstroms to several hundreds of microns, depending on the specific deposition process. The deposition process may also be performed as many times as necessary to obtain the desired film.

In some embodiments, the temperature and the pressure within the reactor are held at conditions suitable for ALD or CVD depositions. For instance, the pressure in the reactor may be held between about 1 Pa and about $10^5$ Pa, or preferably between about 25 Pa and $10^3$ Pa, as required per the deposition parameters. Likewise, the temperature in the reactor may be held between about 100° C. and about 500° C., preferably between about 150° C. and about 350° C.

In some embodiments, the precursor vapor solution and the reaction gas, may be pulsed sequentially or simultaneously (e.g. pulsed CVD) into the reactor. Each pulse of precursor may last for a time period ranging from about 0.01 seconds to about 10 seconds, alternatively from about 0.3 seconds to about 3 seconds, alternatively from about 0.5 seconds to about 2 seconds. In another embodiment, the reaction gas, may also be pulsed into the reactor. In such embodiments, the pulse of each gas may last for a time period ranging from about 0.01 seconds to about 10 seconds, alternatively from about 0.3 seconds to about 3 seconds, alternatively from about 0.5 seconds to about 2 seconds.

EXAMPLES

The following non-limiting examples are provided to further illustrate embodiments of the invention. However, the examples are not intended to be all inclusive and are not intended to limit the scope of the inventions described herein.

Example 1

Synthesis of (cyclopentadienyl)-(bis-isopropylacetamidinate)-nickel

In 100 mL schlenk flask, 0.974 g (7.716 mmol) of bisisopropylcarbodiimide were introduced with 10 mL of THF. MeLi (1.6 M in ether) 4.82 mL (7.716 mmol) was introduced dropwise at $-78°$ C. A white precipitate was formed. It was allowed to warm up to room temperature for 1 hour ("h"). To this first solution 1.0 g (7.716 mmol) of $NiCl_2$ was added. It was refluxed at 60° C. under stirring for 16 h. Color slowly turned to dark brown. LiCp 555 mg (7.716 mmol) was then introduced and the final solution allowed to react 1 night (approx 12 hours) at room temperature. Color turned to dark green. Solvent was removed under vacuum and pentane added (20 mL). The solution was filtered over celite and the celite washed with pentane (10 mL). Pentane was removed under vacuum to give a dark green sticky solid. It was sublimed at 40° C./10 mtorr to give a dark green sticky solid, 665 mg (35%). $^1$H NMR $C_6D_6$ δppm=8.0 (s, 2H), 3.49 (s, 3H), 0.91 (s, 12H), 0.12 (s, 5H), MP=13° C.

Example 2

Synthesis of (methylcyclopentadienyl)-(bis-isopropylacetamidinate)-nickel

In 100 mL schlenk flask 0.974 g (7.716 mmol) of bisisopropylcarbodiimide were introduced with 10 mL of THF. MeLi (1.6 M in ether) 4.82 mL (7.716 mmol) was introduced dropwise at $-78$ C. A white precipitate was formed. It was allowed to warm up to room temperature for 1 h. To this first solution 1.0 g (7.716 mmol) of $NiCl_2$ was added. It was refluxed at 60° C. under stirring for 16 h. Color slowly turned to dark brown. LiMeCp 664 mg (7.716 mmol) was then introduced and the final solution allowed to react for 1 night (approx. 12 hours) at room temperature. Color turned to dark green. Solvent were removed under vacuum and pentane added (20 mL). The solution was filtered over celite and the celite washed with pentane (10 mL). Pentane was removed under vacuum to give a dark green liquid. It was distillated at 100° C./20 mTorr to give a dark green liquid, 1.27 g (59%). $^1$H NMR $C_6D_6$ δppm=9.52 (s, 2H), 9.04 (s, 3H), 4.21 (s, 3H), 1.0 (s, 12H), −1.73 (s, 2H), −1.90 (s, 2H) MP=9° C.

Example 3

Synthesis of (ethylcyclopentadienyl)-(bis-isopropylacetamidinate)-nickel

In 100 mL schlenk flask 1.948 g (15.431 mmol) of bisisopropylcarbodiimide were introduced with 20 mL of THF. MeLi (1.6 M in ether) 9.64 mL (15.431 mmol) was introduced dropwise at −78 C. A white precipitate was formed. It was allowed to warm up to room temperature for 1 h. To this first solution 2.0 g (15.431 mmol) of $NiCl_2$ was added. It was refluxed at 60° C. under stirring for 16 h. Color slowly turned to dark brawn. LiEtCp 1.544 g (15.431 mmol) was then introduced and the final solution allowed to react 1 night (approx. 12 hours) at room temperature. Color turned to dark green. Solvent were removed under vacuum and pentane added (20 mL). The solution was filtered over celite and the celite washed with pentane (10 mL). Pentane was removed under vacuum to give a dark green liquid. It was distillated at 100-110° C./14 mTorr to give a dark green liquid, 1.24 g (27%). $^1$H NMR $C_6D_6$ δppm=10.02 (s, 2H), 9.08 (s, 2H), 4.42 (s, 3H), 1.84 (s, 3H), 1.02 (s, 12H), −2.15 (s, 2H), −2.46 (s, 2H).

Example 4

Synthesis of (cyclopentadienyl)-(bis-isopropylacetamidinate)-cobalt

In 100 mL schlenk 1.943 mg (15.4 mmol) of bisisopropylcarbodiimide were introduced with 10 mL of THF. MeLi (1.6 M in ether) 9.625 mL (15.4 mmol) was added dropwise at −78° C. It was allowed to react 1 h at room temperature. To this first solution $CoCl_2$ was added 2.0 g (15.4 mmol). Color turned to dark green. It was refluxed at 80 C under stirring for 5 h. NaCp 1.360 mg (15.4 mmol) was introduced and the final solution allowed to stir 1 night (approx. 12 hours) at room temperature. Color rapidly turned to dark red/brown. Solvents were removed under vacuum and pentane added (20 mL). The solution was filtered over celite and pentane removed under vacuum to give a dark red/brown liquid. It was distilled at 100° C./6 mTorr (bp=65 C@ 6 mTorr) to give a dark red liquid: 1.850 g (45%). $^1$H NMR $C_6D_6$ δppm=4.33 (s, 12H), −23.53 (s, 5H), −51.04 (s, 2H), −69.89 (s, 3H). MP=7° C.

Example 5

PEALD Experiments on $SiO_2$ Using (methylcyclopentadienyl)-(bis-isopropylacetamidinate)-nickel Various depositions (PEALD type) were performed, with this molecule, the results of which are shown below.

| Run# | T, ° C. | Reductant | Type of experiment | Film thickness, Å | Sheet resistivity, μΩ · cm | Comments |
|---|---|---|---|---|---|---|
| 1 | 275 | $H_2$ | PEALD | 180 | 2000 | Ni 99%+, Carbon at detection limit |

-continued

| Run# | T, °C. | Reductant | Type of experiment | Film thickness, Å | Sheet resistivity, µΩ·cm | Comments |
|---|---|---|---|---|---|---|
| 2 | 320 | $H_2$ | PEALD | 250 | 80 | Good surface coverage, very low carbon content |
| 3 | 320 | $H_2 + NH_3$ | PEALD | 600 | 75 | low carbon content |
| 4 | 320 | | Therm CVD (Self-decomp.) | 35 | 0 | No decomposition up to 320° C. |
| 5 | 220 | $H_2$ | CVD | 0 | | No deposition |
| 6 | 275 | $H_2$ | CVD | 20 | | |
| 7 | 275 | $H_2$ | CVD | 110 | 1040 | |

Example 6

PEALD Experiments on $SiO_2$ Using (cyclopentadienyl)-(bis-isopropylacetamidinate)-cobalt Various depositions (PEALD type) were performed, with this molecule, the results of which are shown below.

| Run# | T, °C. | Reductant | Type of experiment | Film thickness, Å | Sheet resistivity, µΩ·cm | Comments |
|---|---|---|---|---|---|---|
| 1 | 250 | $NH_3$ | PEALD | 250 | 140 | Good surface coverage |
| 2 | 200 | $NH_3$ | PEALD | 190 | 150 | Good surface coverage |
| 3 | 100 | $NH_3$ | PEALD | 130 | 145 | Good surface coverage |

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of forming a metal-containing film on a substrate, comprising:
   a) providing a reactor and at least one substrate disposed therein;
   b) introducing a metal-containing precursor into the reactor, wherein the metal-containing precursor comprises a precursor of the general formula:

$$M(R_1-N-C(R_2)=N-R_3)_n(R_4R_5R_6R_7R_8Cp)_mL_k \quad (I)$$

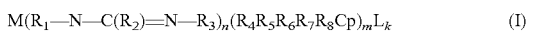

wherein:
   M is at least one member selected from the group consisting of: Ni; Co; and Ru;
   $(R_1-N-C(R_2)=N-R_3)$ is an amidine ligand;
   $(R_4R_5R_6R_7R_8 Cp)$ is a, substituted or unsubstituted, cyclopentadienyl ligand;
   $R_1, R_3, R_4, R_5, R_6, R_7,$ and $R_8$ are independently selected from H; a C1-C5 alkyl group; and Si(R')$_3$, where R' is independently selected from H, and a C1-C5 alkyl group;
   $R_2$ is independently selected from H or a C1-C5 alkyl group;
   L is a neutral ligand;
   $1 \leq m \leq 4$;
   $1 \leq n \leq 4$; and
   $0 \leq k \leq 5$;
   c) maintaining the reactor at a temperature of at least 100° C.; and
   d) contacting the precursor with the substrate to form a metal-containing film.

2. The method of claim 1, wherein the metal-containing precursor comprises a precursor of the general formula:

$$M(R_1-N-C(R_2)=N-R_3)_n(R_4R_5R_6R_7R_8Cp)_mL_k \quad (I)$$

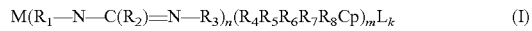

wherein:
   $(R_1-N-C(R_2)=N-R_3)$ is bis isopropylacetamidinate, wherein $R_1=R_3=$isopropyl and $R_2=$methyl;
   $(R_4R_5R_6R_7R_8Cp)$ is either: methylcyclopentadienyl, wherein $R_4=$Me and $R_5=R_6=R_7=R_8=$H; or tetramethylcyclopentadienyl, wherein $R_4=$H and $R_5=R_6=R_7=R_8=$Me;
   m=n=1; and
   k=0.

3. The method of claim 1, further comprising maintaining the reactor at a temperature between about 100° C. to about 500° C.

4. The method of claim 3, further comprising maintaining the reactor at a temperature between about 150° C. and about 350° C.

5. The method of claim 1, further comprising maintaining the reactor at a pressure between about 1 Pa and about $10^5$ Pa.

6. The method of claim 5, further comprising maintaining the reactor at a pressure between about 25 Pa and about $10^3$ Pa.

7. The method of claim 1, further comprising introducing at least one reducing gas into the reactor, wherein the reducing gas comprises at least one member selected from the group consisting of: $H_2$; $NH_3$, $SiH_4$; $Si_2H_6$; $Si_3H_8$; $SiH_2Me_2$, $SiH_2Et_2$, $N(SiH_3)_3$, hydrogen radicals; and mixtures thereof.

8. The method of claim 7, wherein the metal-containing precursor and the reducing gas are introduced into the chamber substantially simultaneously, and the chamber is configured for chemical vapor deposition.

9. The method of claim 7, wherein the metal-containing precursor and the reducing gas are introduced into the chamber substantially simultaneously, and the chamber is configured for plasma enhanced chemical vapor deposition.

10. The method of claim 7, wherein the metal-containing precursor and the reducing gas are introduced into the chamber sequentially, and the chamber is configured for atomic layer deposition.

11. The method of claim 7, wherein the metal-containing precursor and the reducing gas are introduced into the chamber sequentially, and the chamber is configured for plasma enhanced atomic layer deposition.

12. The method of claim 1, further comprising introducing at least one oxidizing gas into the reactor, wherein the oxidizing gas comprises at least one member selected from the group consisting of: $O_2$; $O_3$; $H_2O$; NO; oxygen radicals; and mixtures thereof.

13. The method of claim 12, wherein the metal-containing precursor and the oxidizing gas are introduced into the chamber substantially simultaneously, and the chamber is configured for chemical vapor deposition.

14. The method of claim 12, wherein the metal-containing precursor and the oxidizing gas are introduced into the chamber substantially simultaneously, and the chamber is configured for plasma enhanced chemical vapor deposition.

15. The method of claim 12, wherein the first metal-containing precursor and the oxidizing gas are introduced into the chamber sequentially, and the chamber is configured for atomic layer deposition.

16. The method of claim 12, wherein the first metal-containing precursor and the oxidizing gas are introduced into the chamber sequentially, and the chamber is configured for plasma enhanced atomic layer deposition.

17. The method of claim 1, wherein the metal-containing precursor comprises at least one member selected from the group consisting of: (cyclopentadienyl)-(bis-isopropylacetamidinate)-nickel; (methylcyclopentadienyl)-(bis-isopropylacetamidinate)-nickel; (ethylcyclopentadienyl)-(bis-isopropylacetamidinate)-nickel; (isopropylcyclopentadienyl)-(bis-isopropylacetamidinate)-nickel; (tetramethylcyclopentadienyl)-(bis-isopropylacetamidinate)-nickel; (cyclopentadienyl)-(methyl-isopropylacetamidinate)-nickel; (methylcyclopentadienyl)-(methyl-isopropylacetamidinate)-nickel; (ethylcyclopentadienyl)-(methyl-isopropylacetamidinate)-nickel; (cyclopentadienyl)-(methyl-ethylacetamidinate)-nickel; (methylcyclopentadienyl)-(methyl-ethylacetamidinate)-nickel; (ethylcyclopentadienyl)-(methyl-ethylacetamidinate)-nickel; (cyclopentadienyl)-(bis-isopropylformamidinate)-nickel; (methylcyclopentadienyl)-(bis-isopropylformamidinate)-nickel; and (ethylcyclopentadienyl)-(bis-isopropylformamidinate)-nickel.

18. The method of claim 1, wherein the metal-containing precursor comprises at least one member selected from the group consisting of: (cyclopentadienyl)-(bis-isopropylacetamidinate)-cobalt; (methylcyclopentadienyl)-(bis-isopropylacetamidinate)-cobalt; (ethylcyclopentadienyl)-(bis-isopropylacetamidinate)-cobalt; (isopropylcyclopentadienyl)-(bis-isopropylacetamidinate)-cobalt; (tetramethylcyclopentadienyl)-(bis-isopropylacetamidinate)-cobalt; (cyclopentadienyl)-(methyl-isopropylacetamidinate)-cobalt; (methylcyclopentadienyl)-(methyl-isopropylacetamidinate)-cobalt; (ethylcyclopentadienyl)-(methyl-isopropylacetamidinate)-cobalt; (cyclopentadienyl)-(methyl-ethylacetamidinate)-cobalt; (methylcyclopentadienyl)-(methyl-ethylacetamidinate)-cobalt; (ethylcyclopentadienyl)-(methyl-ethylacetamidinate)-cobalt; (cyclopentadienyl)-(bis-isopropylformamidinate)-cobalt; (methylcyclopentadienyl)-(bis-isopropylformamidinate)-cobalt; and (ethylcyclopentadienyl)-(bis-isopropylformamidinate)-cobalt.

19. The method of claim 1, wherein the metal-containing precursor comprises at least one member selected from the group consisting of: (cyclopentadienyl)-(bis-isopropylacetamidinate)-ruthenium; (methylcyclopentadienyl)-(bis-isopropylacetamidinate)-ruthenium; (ethylcyclopentadienyl)-(bis-isopropylacetamidinate)-ruthenium; (isopropylcyclopentadienyl)-(bis-isopropylacetamidinate)-ruthenium; (tetramethylcyclopentadienyl)-(bis-isopropylacetamidinate)-ruthenium; (cyclopentadienyl)-(methyl-isopropylacetamidinate)-ruthenium; (methylcyclopentadienyl)-(methyl-isopropylacetamidinate)-ruthenium; (ethylcyclopentadienyl)-(methyl-isopropylacetamidinate)-ruthenium; (cyclopentadienyl)-(methyl-ethylacetamidinate)-ruthenium; (methylcyclopentadienyl)-(methyl-ethylacetamidinate)-ruthenium; (ethylcyclopentadienyl)-(methyl-ethylacetamidinate)-ruthenium; (cyclopentadienyl)-(bis-isopropylformamidinate)-ruthenium; (methylcyclopentadienyl)-(bis-isopropylformamidinate)-ruthenium; and (ethylcyclopentadienyl)-(bis-isopropylformamidinate)-ruthenium.

* * * * *